(12) United States Patent
Okamoto et al.

(10) Patent No.: US 8,547,013 B2
(45) Date of Patent: Oct. 1, 2013

(54) ORGANIC EL DISPLAY DEVICE WITH A COLOR CONVERTING LAYER

(75) Inventors: Ken Okamoto, Osaka (JP); Yoshimasa Fujita, Osaka (JP); Hidenori Ogata, Osaka (JP); Yuhki Kobayashi, Osaka (JP); Makoto Yamada, Osaka (JP); Katsumi Kondoh, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/575,593

(22) PCT Filed: Oct. 29, 2010

(86) PCT No.: PCT/JP2010/069354
§ 371 (c)(1),
(2), (4) Date: Aug. 22, 2012

(87) PCT Pub. No.: WO2011/102024
PCT Pub. Date: Aug. 25, 2011

(65) Prior Publication Data
US 2012/0319569 A1    Dec. 20, 2012

(30) Foreign Application Priority Data
Feb. 17, 2010  (JP) ................... 2010-032407

(51) Int. Cl.
*H05B 33/00*  (2006.01)
(52) U.S. Cl.
USPC .............................. 313/504; 313/506; 257/10

(58) Field of Classification Search
USPC .................. 313/504–506, 512; 428/690, 977
See application file for complete search history.

(56) References Cited

U.S. PATENT DOCUMENTS
2009/0212696 A1    8/2009    Terao

FOREIGN PATENT DOCUMENTS

| JP | 2004-127855 A | 4/2004 |
|---|---|---|
| JP | 2008-86970 A | 4/2008 |
| JP | 2009-104893 A | 5/2009 |
| JP | 2009-205928 A | 9/2009 |
| WO | 2006/009039 A1 | 1/2006 |

OTHER PUBLICATIONS

International Search Report received for PCT Patent Application No. PCT/JP2010/069354, mailed on Feb. 8, 2011, 5 pages. (2 pages of English translation and 3 pages of PCT Search Report).

*Primary Examiner* — Joseph L Williams
(74) *Attorney, Agent, or Firm* — Morrison & Foerster LLP

(57) ABSTRACT

A display device of the present invention includes a red-light-emitting element (1), a green-light-emitting element (2), and a blue-light-emitting element (3). The red-light-emitting element (1) and the green-light-emitting element (2) each include an organic EL section (20) and a color converting layer (15). The color converting layer (15) has an optical distance that extends from (i) a position of the color converting layer from which position light is emitted to (ii) an extraction surface of the color converting layer, the optical distance being varied between the red-light-emitting element (1) and (2). The blue-light-emitting element (3) may include a film-thickness adjusting layer (19) instead of the color converting layer (15).

10 Claims, 2 Drawing Sheets

Film Thickness (μm) Of Color Converting Layer (Green)

Film Thickness (μm) Of Planarizing Film

ORGANIC EL DISPLAY DEVICE WITH A COLOR CONVERTING LAYER

CROSS REFERENCE TO RELATED APPLICATIONS

This is a U.S. National Phase patent application of PCT/JP2010/069354, filed Oct. 29, 2010, which claims priority to Japanese Patent Application No. 2010-032407, filed Feb. 17, 2010, each of which is hereby incorporated by reference in the present disclosure in its entirety.

TECHNICAL FIELD

The present invention relates to a display device including light-emitting elements emitting light of a plurality of colors.

BACKGROUND ART

Recent years have witnessed development of an organic EL (electroluminescence) display as a display device to replace a liquid crystal display device. An organic EL component, which is of a self-light-emitting type, allows a wide viewing angle and high visibility. Further, since it is a full solid-state component in the shape of a thin film, an organic EL component has been drawing attention in terms of space saving, portability and the like.

Under such circumstances, there is a demand for improvement in luminous efficiency of an organic EL component. A known method for such improvement is a method of using a microresonator structure to efficiently extract light from a light-emitting layer of the organic EL component.

An organic EL component having a microresonator structure includes a light-emitting layer that generates light, which is repeatedly reflected between a reflective electrode and a transflective electrode. This causes only light having an identical wavelength to be emitted from the side of the transflective electrode, and consequently causes light to be high in intensity at a particular wavelength and to be emitted with directivity.

In the case where organic EL is used for a color display, such a color display typically includes organic EL components provided in correspondence with the respective ones of the three primary colors (RGB). Organic EL components can be provided respectively for R, G, and B by a method such as a fluorescence conversion method, which uses a color converting layer that absorbs light emitted from a light-emitting layer and that emits light having a wavelength different from that of the absorbed light. Patent Literature 1, for example, discloses an organic EL component that uses a fluorescence conversion method in combination with the above microresonator structure.

CITATION LIST

Patent Literature 1
Japanese Patent Application Publication, Tokukai, No. 2009-205928 A (Publication Date: Sep. 10, 2009)

SUMMARY OF INVENTION

Technical Problem

A typical organic EL component based on a fluorescence conversion method uses light from an organic EL layer (that is, a first light-emitting section) to emit light from a color converting layer (that is, a second light-emitting section). An organic EL component based on a fluorescence conversion method is thus low in efficiency of extracting light to the outside of the substrate as compared to an organic EL component including no color converting layer. An organic EL component based on a fluorescence conversion method consequently tends to have high power consumption. Improving luminous efficiency of such an organic EL component is thus a more important issue.

The organic EL component disclosed in Patent Literature 1 above involves an attempt to increase the intensity of converted light emitted by a color converting layer. Specifically, Patent Literature 1 adjusts the thickness of the color converting layer between a pair of reflection films to adjust the distance between such a pair of reflection films forming a microresonator structure. This arrangement, however, includes a color converting layer between a pair of reflection films, which causes the pair of reflection films forming a microresonator structure to be separated from each other by a large distance. This unfortunately allows converted light emitted by the color converting layer to be scattered in a lateral direction before being resonated. In addition, placing a reflection film further on a light extraction side than a color converting layer causes a reflective electrode and the reflection film to be separated from each other by a large distance. This unfortunately allows light to (i) travel in a lateral direction during an optical interference or to (ii) be absorbed by an organic layer, an electrode, and/or an inorganic layer provided between the reflective electrode and the reflection film, resulting in a large loss. The above organic EL component thus requires an extremely high driving voltage, which is a critical defect. Furthermore, Patent Literature 1 includes no discussion about efficiency of extracting converted light from the color converting layer. This makes it difficult to produce, on the basis of the organic EL component disclosed in Patent Literature 1, an optical organic EL component having improved luminous efficiency.

The present invention has been accomplished in view of the above problems. It is an object of the present invention to further improve, in a display device including light-emitting elements emitting light of respective colors different from one another, luminous efficiency of such light-emitting elements.

Solution to Problem

In order to solve the above problems, a display device of the present invention includes: a plurality of arranged light-emitting elements including light-emitting elements emitting light of respective colors different from one another, the plurality of arranged light-emitting elements each including: a pair of electrodes forming a microresonator structure and including a translucent electrode; an organic EL layer sandwiched between the pair of electrodes; and a color converting layer provided on a side of the translucent electrode which side is opposite to a side on which the organic EL layer is provided, such that the translucent electrode is sandwiched between the color converting layer and the organic EL layer, the color converting layer (i) absorbing light emitted by the organic EL layer and having a first color and (ii) emitting converted light having a second color different from the first color, the color converting layer having an optical distance extending from (i) a first surface of the color converting layer which first surface faces the translucent electrode to (ii) a second surface of the color converting layer at which second surface the converted light is extracted, the optical distance being varied according to each color of light emitted by the plurality of arranged light-emitting elements.

According to the above arrangement, the organic EL layer serving as the first light-emitting section emits light having a first color, whereas the color converting layer serving as the second light-emitting section absorbs that light and emits converted light having a second color different from the first color. This arrangement allows color converting layers of respective light-emitting elements having respective colors different from one another to emit converted light having colors different from one another. The above arrangement consequently allows the display device of the present invention to emit light having a plurality of colors.

The above arrangement includes a pair of electrodes that form a microresonator structure. According to this arrangement, the organic EL layer serving as the first light-emitting section emits light, the intensity of which is increased due to an interference effect caused by the microresonator structure. This light consequently has directivity.

Further, according to the above arrangement, the optical distance, which extends from (i) a position of the color converting layer from which position light is emitted to (ii) a surface of the color converting layer at which surface converted light is extracted, is varied according to each of the plurality of light-emitting elements. The extraction of light from the color converting layer has an efficiency that is determined on the basis of the above optical distance of the color converting layer and the color (wavelength) of the converted light. The above arrangement thus allows the converted light, which is emitted by the color converting layer serving as the second light-emitting section, to be easily extracted from the converted light.

The display device of the present invention thus has, in each light-emitting element, improved light extraction efficiency for both the organic EL layer serving as the first light-emitting section and the light converting layer serving as the second light-emitting section. The above arrangement consequently makes it possible to further improve luminous efficiency of each light-emitting element.

Advantageous Effects of Invention

A display device of the present invention includes: a plurality of arranged light-emitting elements including light-emitting elements emitting light of respective colors different from one another, the plurality of arranged light-emitting elements each including: a pair of electrodes forming a microresonator structure and including a translucent electrode; an organic EL layer sandwiched between the pair of electrodes; and a color converting layer provided on a side of the translucent electrode which side is opposite to a side on which the organic EL layer is provided, such that the translucent electrode is sandwiched between the color converting layer and the organic EL layer, the color converting layer (i) absorbing light emitted by the organic EL layer and having a first color and (ii) emitting converted light having a second color different from the first color, the color converting layer having an optical distance extending from (i) a first surface of the color converting layer which first surface faces the translucent electrode to (ii) a second surface of the color converting layer at which second surface the converted light is extracted, the optical distance being varied according to each color of light emitted by the plurality of arranged light-emitting elements. This arrangement achieves the advantage of further improving luminous efficiency of each light-emitting element.

DESCRIPTION OF EMBODIMENTS

The description below deals with a display device of the present embodiment with reference to FIG. 1.

The description below deals with a display device including red-, green-, and blue-light-emitting elements. The present invention is, however, not limited to such an arrangement. In the case where, for instance, the display device includes a plurality of primary color elements of white, yellow, magenta, cyan and the like, such a display device can, for example, have low power consumption and a wide color reproduction range.

Figure 1:
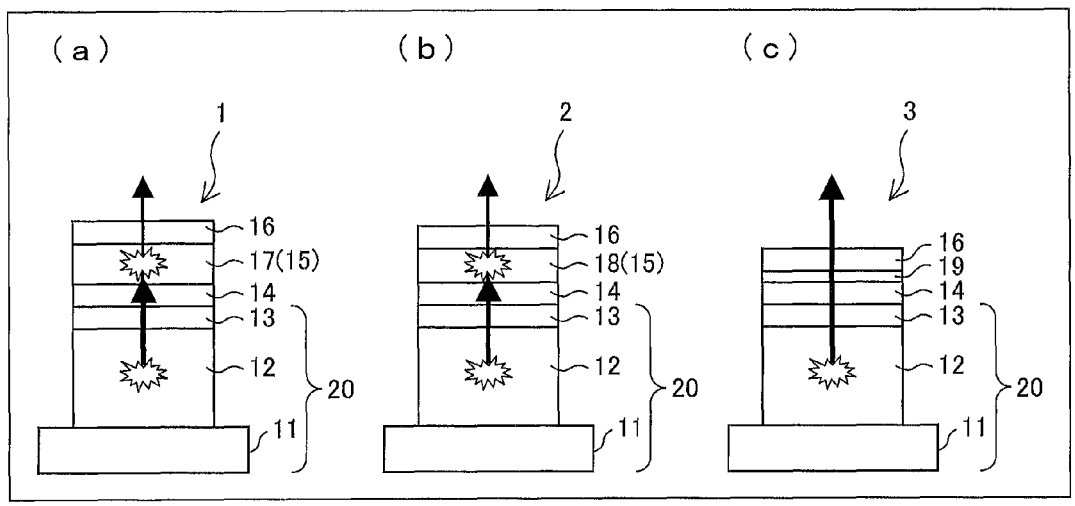
FIG. 1 shows cross-sectional views illustrating respective structures of individual light-emitting elements included in a display device of an embodiment of the present invention, where (a) illustrates the structure of a red-light-emitting element, (b) illustrates the structure of a green-light-emitting element, and (c) illustrates the structure of a blue-light-emitting element.

FIG. 1 shows diagrams illustrating examples of respective structures of light-emitting elements 1 through 3 included in the display device of the present embodiment. Specifically, (a) of FIG. 1 illustrates the structure of the red-light-emitting element 1, (b) of FIG. 1 illustrates the structure of the green-light-emitting element 2, and (c) of FIG. 1 illustrates the structure of the blue-light-emitting element 3.

Among the light-emitting elements 1 through 3, the red-light-emitting element 1 and the green-light-emitting element 2 each include: a substrate (not shown); an organic EL section 20; a sealing film 14; a fluorescent substance layer (color converting layer) 15; and a substrate 16 provided with a CF (color filter), arranged in that order. The blue-light-emitting element 3, on the other hand, does not include a fluorescent substance layer 15, but includes a film-thickness adjusting layer 19 instead. In other words, the blue-light-emitting element 3 includes: a substrate (not shown); an organic EL section 20; a sealing film 14; a film-thickness adjusting layer 19; and a CF-provided substrate 16, arranged in that order.

In each of the light-emitting elements 1 through 3, the organic EL section 20 includes: a first electrode 11; an organic EL layer 12; and a second electrode 13, in that order from the substrate side. The organic EL section 20 has, between the first electrode 11 and the second electrode 13, an optical distance so adjusted as to form a microresonator structure.

The organic EL layer 12 desirably emits blue or ultraviolet organic EL light in order to be used in a display device (display). This arrangement allows the color of high-energy light to be converted into green, red, or blue. The organic EL layer 12 of the present embodiment emits blue light.

The light-emitting elements 1 through 3 may each include (i) a TFT, an interlayer insulating film, and a planarizing film (not shown) stacked on top of one another in that order between the substrate and the first electrode 11 and (ii) a polarizing plate (not shown) on a light extraction side.

The light-emitting elements 1 through 3, as illustrated in FIG. 1, each have a structure of a top emission type. The present invention is, however, not limited to such a structure, and may have a structure of a bottom emission type.

The description below deals in greater detail with (i) individual members of the display device of the present embodiment and (ii) a method for producing the display device. The present invention is, however, not limited by the description below.

(1. Substrate)

The following describes a substrate on which the organic EL section 20 is provided.

The substrate is not particularly limited, and can be an insulating substrate such as (i) an inorganic material substrate made of glass, quartz or the like, (ii) a plastic substrate made of polyethylene terephthalate, polycarbazole, polyimide or the like, or (iii) a ceramics substrate made of alumina or the like. The substrate can alternatively be (i) a metal substrate made of aluminum (Al), iron (Fe) or the like, (ii) a metal substrate, such as the above, that has a surface coated with an insulator made of silicon oxide ($SiO_2$), an organic insulating material or the like, or (iii) a metal substrate, such as the above, that has a surface which has been subjected to an insulating process by a method such as anodic oxidation.

The light-emitting elements each preferably include, among the above substrates, a plastic substrate or metal substrate because these substrates can each be, for example, curved or bent with no stress.

An organic EL component is commonly known to be degraded by, in particular, even a small amount of water. Thus, in the case where a plastic substrate is used as the above substrate, the organic EL component may be problematically degraded due to penetration of water. Further, it is also known that since an organic EL component has an extremely small film thickness of approximately 100 to 200 nm, a leak (short circuit) can easily occur in a current through a pixel section due to projection of the organic EL component. In view of this, the substrate on which the organic EL section 20 is formed is, among others, more preferably (i) a plastic substrate coated with an inorganic material or (ii) a metal substrate coated with an inorganic insulating material. These substrates can each solve both of the above problems.

In the case where a TFT is provided on the substrate, the substrate is preferably a substrate that is not melted or deformed at a temperature of 500° C. or below. Since a typical metal substrate has a thermal expansion coefficient which is different from that of glass, it is difficult to form a TFT on a metal substrate with use of a conventional production device. However, in the case where (i) the above substrate is a metal substrate made of an iron-nickel alloy having a linear expansion coefficient of $1 \times 10^{-5}$/° C. or below and (ii) that linear expansion coefficient is matched with that of glass, a TFT can be formed on a metal substrate inexpensively even with use of a conventional production device. Further, although a typical plastic substrate is only resistant to an extremely low temperature, a TFT can be formed on such a plastic substrate by means of transfer by first (i) forming a TFT on a glass substrate and then (ii) transferring the TFT onto the plastic substrate.

In the case where light emitted by the organic EL section 20 is extracted from the side opposite to the substrate side as in the present embodiment, the substrate is not limited in terms of transparency. In the case where light emitted by the organic EL section 20 is extracted from the substrate side, the substrate needs to be a transparent or translucent substrate.

(2. TFT)

The light-emitting elements each preferably include, on the above substrate, a TFT for switching and driving of a corresponding one of the light-emitting elements 1 through 3. This arrangement allows the display device of the present embodiment to be a display device of an active driving type.

The TFT for use in the present embodiment can be formed of a publicly known material by a publicly known method to have a publicly known structure. The following describes a material, structure, and forming method for the TFT of the present embodiment. The present invention is, however, not limited by the description below.

The TFT includes an active layer that is made of a material such as (i) an inorganic semiconductor material, for example, amorphous silicon, polycrystalline silicon (polysilicon), microcrystalline silicon, or cadmium selenide, (ii) an oxide semiconductor material, for example, zinc oxide or indium oxide-gallium oxide-zinc oxide, and (iii) an organic semiconductor material, for example, a polythiophene derivative, a thiophene oligomer, a poly(p-phenylenevinylene) derivative, or naphthacene. The TFT has a structure of, for example, a staggered type, an inverted staggered type, a top-gate type, or a coplanar type.

The active layer included in the TFT can be formed by any of the various methods below.

A first method is a method of ion-doping an impurity into an amorphous silicon film formed by plasma-excited chemical vapor deposition (PECVD). A second method is a method of (i) forming amorphous silicon by low pressure chemical vapor deposition (LPCVD) involving use of silane ($SiH_4$) gas, (ii) crystallizing the amorphous silicon by solid-phase deposition into polysilicon, and then (iii) doping ions into the polysilicon by ion implantation. A third method is a method (low-temperature process) of (i) forming amorphous silicon by LPCVD involving use of $Si_2H_6$ gas or by PECVD involving use of $SiH_4$ gas, (ii) annealing the amorphous silicon with use of a laser such as an excimer laser to crystallize the amorphous silicon into polysilicon, and then (iii) doping ions. A fourth method is a method (high temperature process) of (i) forming a polysilicon layer by LPCVD or PECVD, (ii) thermally oxidizing the polysilicon layer at a temperature of 1000° C. or above to form a gate insulating film, (iii) forming a gate electrode of n+polysilicon on the gate insulating film, and then (iv) doping ions. A fifth method is a method of forming an organic semiconductor material by a method such as inkjet printing. A sixth method is a method of forming a single-crystal film made of an organic semiconductor material.

The TFT for use in the present invention can include a gate insulating film that is formed of a publicly known material by a publicly known method. The gate insulating film is made of, for example, (i) $SiO_2$ formed by a method such as PECVD and LPCVD or (ii) $SiO_2$ formed by thermal oxidation of a polysilicon film.

The TFT for use in the present invention includes a signal electrode wire, a scanning electrode wire, a common electrode wire, a first drive electrode, and a second drive electrode, each of which is made of a publicly known material, for example, tantalum (Ta), aluminum (Al), or copper (Cu).

The TFT may be replaced by a metal-insulator-metal (MIM) diode.

(3. Interlayer Insulating Film)

The light-emitting elements each preferably include an interlayer insulating film on the substrate on which the TFT has been formed as above.

The interlayer insulating film for use in the present embodiment can be formed of a publicly known material by a publicly known method. The following describes a material and forming method for the interlayer insulating film for use in the present embodiment. The present invention is, however, not limited by the description below.

The interlayer insulating film can be made of a material such as (i) an inorganic material, for example, silicon oxide ($SiO_2$), silicon nitride (SiN or $Si_2N_4$), or tantalum oxide (TaO or $Ta_2O_5$), and (ii) an organic material, for example, an acrylic resin or a resist material. The interlayer insulating film can be formed by a method such as (i) a dry process, for example, chemical vapor deposition (CVD) or vacuum deposition, and (ii) a wet process, for example, spin coating. The interlayer insulating film can alternatively be patterned by a method such as photolithography as necessary.

The interlayer insulating film is more preferably a light-blocking insulating film that serves also to block light. Such a light-blocking insulating film can prevent a change caused in TFT property by external light incident on the TFT provided on the substrate. The light-blocking insulating film may be used in combination with the above insulating film.

The light-blocking interlayer insulating film is made of, for example, (i) a pigment or dye, such as phthalocyanine and quinacridone, that is dispersed in a polymer resin such as a polyimide, (ii) a color resist, (iii) a black matrix material, or (iv) an inorganic insulating material such as $Ni_xZn_yFe_2O_4$.

(4. Planarizing Film)

In the case where the TFT has been formed on the substrate, the substrate has an uneven surface. Such unevenness may cause, for example, defects in an organic EL section (for example, a defect in a pixel electrode, a defect in the organic EL layer, a breakage in a counter electrode, a short circuit between a pixel electrode and a counter electrode, and reduction in pressure resistance). To prevent such defects, the light-emitting elements each preferably include a planarizing film provided on the interlayer insulating film.

The planarizing film can be formed of a publicly known material by a publicly known method. The planarizing film can be made of a material such as (i) an inorganic material, for example, silicon oxide, silicon nitride, or tantalum oxide, and (ii) an organic material, for example, a polyimide, an acrylic resin, or a resist material. The planarizing film can be formed by a method such as (i) a dry process, for example, CVD or vacuum deposition, and (ii) a wet process, for example, spin coating.

The present invention is, however, not limited by such materials and forming methods. The planarizing film may further have a single-layer structure or a multilayer structure.

(5. Organic EL Section 20)

The light-emitting elements 1 through 3 each include an organic EL section 20. The organic EL section 20 includes the pair of electrodes (namely, the first electrode 11 and the second electrode 13) and the organic EL layer 12 provided between the pair of electrodes. The following describes details of individual layers included in the organic EL section 20.

(5-1. Organic EL Layer 12)

The organic EL layer 12 serving as a first light-emitting section may have (i) a single-layer structure of an organic light-emitting layer or (ii) a multilayer structure including an organic light-emitting layer and a charge transport layer. Specifically, the organic EL layer 12 can have any of the structures below. The present invention is, however, not limited by such structures.

(1) Organic light-emitting layer (2) Positive hole transport layer/organic light-emitting layer (3) Organic light-emitting layer/electron transport layer (4) Positive hole transport layer/organic light-emitting layer/electron transport layer (5) Positive hole injection layer/positive hole transport layer/organic light-emitting layer/electron transport layer (6) Positive hole injection layer/positive hole transport layer/organic light-emitting layer/electron transport layer/electron injection layer (7) Positive hole injection layer/positive hole transport layer/organic light-emitting layer/positive hole blocking layer/electron transport layer (8) Positive hole injection layer/positive hole transport layer/organic light-emitting layer/positive hole blocking layer/electron transport layer/electron injection layer (9) Positive hole injection layer/positive hole transport layer/electron blocking layer/organic light-emitting layer/positive hole blocking layer/electron transport layer/electron injection layer The organic light-emitting layer, the positive hole injection layer, the positive hole transport layer, the positive hole blocking layer, the electron blocking layer, the electron transport layer, and the electron injection layer may each have a single-layer structure or a multilayer structure. The following describes respective arrangements of those individual layers.

The description below first deals with the organic light-emitting layer. The organic light-emitting layer may be made of an organic light-emitting material mentioned below as an example, or may include a combination of a light-emitting dopant and a host material. The organic light-emitting layer may include any of, for example, a positive hole transport material, an electron transport material, and an additive (for example, a donor or an acceptor). The organic light-emitting layer may alternatively include any of the above materials as dispersed in a high-molecular material (binding resin) or in an inorganic material. The organic light-emitting layer, to increase its luminous efficiency and life, preferably includes a light-emitting dopant as dispersed in a host material.

The organic light-emitting material can be a publicly known light-emitting material for organic EL use. Such a light-emitting material is divided into a low-molecular light-emitting material and a high-molecular light-emitting material. The following lists specific compounds as examples of the low-molecular and high-molecular light-emitting materials. The present invention is, however, not limited by the materials below.

The low-molecular organic light-emitting material is, for example, (i) an aromatic dimethylidene compound such as 4,4'-bis(2,2'-diphenylvinyl)-biphenyl (DPVBi), (ii) an oxadiazole compound such as 5-methyl-2-[2-[4-(5-methyl-2-benzoxazolyl)phenyl]vinyl]benzoxazole, (iii) a triazole derivative such as 3-(4-biphenylyl)-4-phenyl-5-t-butylphenyl-1,2,4-triazole (TAZ), (iv) a styrylbenzene compound such as 1,4-bis(2-methylstyryl)benzene, or (v) a fluorescence-emitting organic material such as a fluorenone derivative.

The high-molecular light-emitting material is, for example, (i) a polyphenylenevinylene derivative such as poly (2-decyloxy-1,4-phenylene) (DO-PPP) or (ii) a polyspiro derivative such as poly(9,9-dioctylfluorene) (PDAF).

The light-emitting material may be divided into a fluorescent material, a phosphorescent material and the like. To reduce power consumption, the light-emitting material is preferably a phosphorescent material, which is high in luminous efficiency.

The organic light-emitting layer can include a light-emitting dopant made of a publicly known dopant material for organic EL use. Such a dopant material is, for example, (i) a fluorescence-emitting material such as a styryl derivative or (ii) a phosphorescence-emitting organic metal complex such as bis[(4,6-difluorophenyl)-pyridinato-N,C2']picolinate iridium (III) (FIrpic) and bis(4',6'-difluorophenyl pyridinato) tetrakis(1-pyrazolyl)borate iridium (III) (FIr6).

The host material for a case involving a dopant can be a publicly known host material for organic EL use. Such a host material can be, for example, (i) the above low-molecular light-emitting material, (ii) the above high-molecular light-emitting material, (iii) a carbazole derivative such as 4,4'-bis(carbazole)biphenyl, 9,9-di(4-dicarbazole-benzyl)florene (CPF), 3,6-bis(triphenylsilyl)carbazole (mCP), and (PCF), (iv) an aniline derivative such as 4-(diphenylphosphoryl)-N,N-dipheny aniline (HM-A1), or (v) a florene derivative such as 1,3-bis(9-phenyl-9H-florene-9-yl)benzene (mDPFB) and 1,4-bis(9-phenyl-9H-florene-9-yl)benzene (pDPFB).

The following describes a charge injection/transport layer. The charge injection/transport layer is divided into charge injection layers (namely, the positive hole injection layer and the electron injection layer) and charge transport layers (namely, the positive hole transport layer and the electron transport layer) for the purpose of more efficiently carrying out (i) injection of electric charge (positive holes and electrons) from an electrode and (ii) transport (injection) thereof into an organic light-emitting layer.

The charge injection/transport layer may be made of a charge injection/transport material mentioned below as an example, and may also include any additive (for example, a donor or an acceptor). The charge injection/transport layer may alternatively include any of those materials as dispersed in a high-molecular material (binding resin) or in an inorganic material.

The charge injection/transport material can be a publicly known charge injection/transport material for organic EL use or for use in an organic photo conductor. Such a charge injection/transport material is divided into a positive hole injection/transport material and an electron injection/transport material. The following lists specific compounds as examples of the positive hole injection/transport material and the electron injection/transport material. The present invention is, however, not limited by the materials below.

First, the positive hole injection/positive hole transport material is, for example (i) an oxide such as vanadium oxide ($V_2O_5$) and molybdenum oxide ($MoO_2$), (ii) an inorganic p-type semiconductor material, (iii) a porphyrin compound, (iv) an aromatic tertiary amine compound such as N,N'-bis(3-methylphenyl)-N,N'-bis(phenyl)-benzidine (TPD) and N,N'-di(naphthalene-1-yl)-N,N'-dipheny-benzidine (NPD), (v) a low-molecular material such as a hydrazone compound, a quinacridone compound, and a styrilamine compound, or (vi) a high-molecular material such as polyaniline (PANI), polyaniline-camphor sulfonic acid (PANI-CSA), 3,4-polyethylene dioxy thiophene/polystyrene sulfonate (PEDOT/PSS), a poly(triphenylamine) derivative (Poly-TPD), polyvinylcarbazole (PVCz), poly(p-phenylenevinylene) (PPV), and poly(p-naphthalenevinylene) (PNV).

For more efficient injection and transport of positive holes from the anode, the positive hole injection layer is preferably made of a material that is lower in energy level of the highest occupied molecular orbital (HOMO) than the positive hole injection/transport material of which the positive hole transport layer is made. The positive hole transport layer is preferably made of a material that is higher in mobility of positive holes than the positive hole injection/transport material of which the positive hole injection layer is made.

To further facilitate injection and transport of positive holes, the positive hole injection/transport material is preferably doped with an acceptor. The acceptor can be made of a publicly known acceptor material for organic EL use. The following lists specific compounds as examples of the acceptor material. The present invention is, however, not limited by the materials below.

The acceptor material is, for example, (i) an inorganic material such as Au, Pt, W, Ir, $POCl_3$, $AsF_6$, Cl, Br, I, vanadium oxide ($V_2O_5$), and molybdenum oxide ($MoO_2$), (ii) a compound containing a cyano group, such as TCNQ (7,7,8,8-tetracyanoquinodimethane), $TCNQF_4$ (tetrafluorotetracyanoquinodimethane), TCNE (tetracyanoethylene), HCNB (hexacyano butadiene), and DDQ (dicyclodicyano benzoquinone), (iii) a compound containing a nitro group, such as TNF (trinitro fluorenone) and DNF (dinitro fluorenone), or (iv) an organic material such as fluoranil, chloranil, and bromanil. To further increase carrier concentration effectively, the acceptor material is preferably, among the above compounds, a compound containing a cyano group, such as TCNQ, $TCNQF_4$, TCNE, HCNB, and DDQ.

The electron injection/electron transport material is, for example, (i) a low-molecular material such as an inorganic material serving as an n-type semiconductor, an oxadiazole derivative, a triazole derivative, a thiopyrazine dioxide derivative, a benzoquinone derivative, a naphthoquinone derivative, an anthraquinone derivative, a diphenoquinone derivative, a fluorenone derivative, and a benzodifuran derivative, or (ii) a high-molecular material such as poly(oxadiazole) (Poly-OXZ) and polystyrene derivative (PSS). The electron injection material, in particular, is, for example, (i) a fluoride such as lithium fluoride (LiF) and barium fluoride ($BaF_2$) or (ii) an oxide such as lithium oxide ($Li_2O$).

For more efficient injection and transport of electrons from the cathode, the electron injection layer is preferably made of a material that is higher in energy level of the lowest unoccupied molecular orbital (LUMO) than the electron injection/transport material of which the electron transport layer is made. The electron transport layer is preferably made of a material that is higher in mobility of electrons than the electron injection/transport material of which the electron injection layer is made.

To further facilitate injection and transport of electrons, the electron injection/transport material is preferably doped with a donor. The donor can be made of a publicly known donor material for organic EL use. The following lists specific compounds as examples of the donor material. The present invention is, however, not limited by the materials below.

The donor material is, for example, (i) an inorganic material such as an alkali metal, an alkali earth metal, a rare earth element, Al, Ag, Cu, and In, (ii) a compound containing an aromatic tertiary amine as its skeleton, such as an aniline, a phenylenediamine, a benzidine (for example, N,N,N',N'-tetraphenyl benzidine, N,N'-bis-(3-methylphenyl)-N,N'-bis-(phenyl)-benzidine, and N,N'-di(naphthalene-1-yl)-N,N'-dipheny-benzidine), a triphenylamine (for example, triphenylamine, 4,4'4"-tris(N,N-dipheny-amino)-triphenylamine, 4,4'4"-tris(N-3-methylphenyl-N-phenyl-amino)-triphenylamine, and 4,4'4"-tris(N-(1-naphthyl)-N-phenyl-amino)-triphenylamine), and a triphenyldiamine (for example, N,N'-di-(4-methyl-phenyl)-N,N'-dipheny-1,4-phenylenediamine), (iii) a condensed polycyclic compound (which may optionally contain a substituent group) such as phenanthrene, pyrene, perylene, anthracene, tetracene, and pentacene, or (iv) an organic material such as a TTF (tetrathiafulvalene), dibenzofuran, phenothiazine, and carbazole. To further increase carrier concentration effectively, the donor material is preferably, among the above compounds, a compound containing an aromatic tertiary amine as its skeleton, a condensed polycyclic compound, or an alkali metal.

The organic EL layer 12, which includes the light-emitting layer, the positive hole transport layer, the electron transport layer, the positive hole injection layer, and the electron injection layer all described above, can be formed by a method described below.

The organic EL layer can be formed, with use of an application liquid for forming each organic EL layer which application liquid includes the above material dissolved and dispersed in a solvent, by a publicly known wet process such as (i) an application method (for example, spin coating, dipping, doctor blade method, discharge coating, and spray coating) and (ii) a printing method (for example, inkjet printing, relief printing, intaglio printing, screen printing, and micro gravure coating). Alternatively, the above material can be processed by, for example, (i) a publicly known dry process such as resistance heating vapor deposition, electron beam (EB) vapor deposition, molecular-beam epitaxy (MBE), sputtering, and organic vapor-phase deposition (OVPD) or (ii) a laser transfer method.

In the case where the organic EL layer 12 is formed by a wet process, the application liquid for forming an organic EL layer may include an additive, such as a leveling agent and a viscosity adjusting agent, for use in adjusting a physical property of the application liquid. The organic EL layers may each be formed by a device of a bottom emission type or a device of a top emission type. Regardless of which device, it is preferably so designed that both electrodes are reflective electrodes and that organic EL light efficiently reaches the fluorescent substance layer 15 with use of a microcavity between the electrodes.

While a typical organic EL layer has a film thickness of approximately 1 to 1000 nm, the organic EL layer 12 preferably has a film thickness of 10 to 200 nm. If the film thickness is less than 10 nm, (i) it will be impossible to achieve normally required physical properties (namely, a charge injection property, a charge transport property, and a charge trapping property), and (ii) there may occur a pixel defect due to a foreign body such as dirt. If the film thickness exceeds 200 nm, the organic EL layer 12 will include a resistance component that increases a driving voltage, resulting in an increase in power consumption.

(5-2. First Electrode 11 and Second Electrode 13)

The first electrode layer 11 is provided above the TFT with an interlayer insulating film and a planarizing film inserted therebetween. The second electrode layer 13 is provided on the organic EL layer 12.

The first electrode 11 and the second electrode 13 function as a pair of an anode and a cathode for the organic EL section 20. Specifically, (i) in the case where the first electrode serves as an anode, the second electrode serves as a cathode, and (ii) in the case where the first electrode serves as a cathode, the second electrode serves as an anode. In the present embodiment, the first electrode 11 is the electrode provided on the substrate.

The first electrode and the second electrode can each be made of a publicly known electrode material. The following describes specific compounds and forming methods as examples. The present invention is, however, not limited by such materials and forming methods.

For more efficient injection of positive holes into the organic EL layer 12, the cathode is made of, for example, an electrode material such as (i) a metal having a work function of 4.5 eV or greater, for example, gold (Au), platinum (Pt), and nickel (Ni), and (ii) a transparent electrode material, for example, an oxide (ITO) including indium (In) and tin (Sn), an oxide ($SnO_2$) including tin (Sn), or an oxide (IZO) including indium (In) and zinc (Zn).

For more efficient injection of electrons into the organic EL layer 12, the cathode is made of, for example, an electrode material having a work function of 4.5 eV or less, such as (i) a metal, for example, lithium (Li), calcium (Ca), cerium (Ce), barium (Ba), or aluminum (Al), and (ii) an alloy containing any of the above metals, for example, a Mg:Ag alloy or a Li:Al alloy.

The first electrode 11 and the second electrode 13 can each be formed of any of the above materials by a publicly known method such as EB vapor deposition, sputtering, ion plating, and resistance heating vapor deposition. The present invention is, however, not limited by such forming methods. The present invention may (i) pattern a formed electrode as necessary by photolithography or laser ablation, or may (ii) further use a shadow mask to directly form a patterned electrode.

The first electrode 11 and the second electrode 13 are separated from each other by an optical distance that is so adjusted as to form a microresonator structure (microcavity structure). In this case, it is preferable that (i) the first electrode 11 be a reflective electrode and (ii) the second electrode 13 be a translucent electrode.

The translucent electrode can be a material including (i) only a metal translucent electrode or (ii) a combination of a metal translucent electrode and a transparent electrode material. The translucent electrode material is, in particular, preferably silver or a silver alloy in terms of reflectance and transmittance.

The second electrode 13, which is a translucent electrode, preferably has a film thickness of 5 to 30 nm. If the translucent electrode has a film thickness of less than 5 nm, the organic EL section will be unable to reflect light sufficiently, which will in turn make it impossible to produce an interference effect sufficiently. If the film thickness exceeds 30 nm, the organic EL section will have a significantly low light transmittance, which may in turn decrease luminance and efficiency.

The first electrode 11, which is a reflective electrode, is preferably made of an electrode that is high in reflectance with respect to light. The reflective electrode is a reflective metal electrode made of, for example, aluminum, silver, gold, an aluminum-lithium alloy, an aluminum-neodymium alloy, or an aluminum-silicon alloy. The reflective electrode may alternatively be an electrode that combines a transparent electrode with the reflective metal electrode.

In the case where the first electrode 11 and the second electrode 13 have formed a microresonator structure, that structure can focus light, emitted from the organic EL layer 12, toward a frontal direction (that is, a light extraction direction) with use of an interference effect of the first electrode 11 and the second electrode 13. In other words, the above structure allows light emission from the organic EL layer 12 to have directivity. This arrangement can thus (i) reduce a light emission loss caused by the light escaping in a direction different from the frontal direction, and (ii) increase luminous efficiency of the organic EL layer. The above arrangement can consequently (i) cause light emission energy generated by the organic EL section to be propagated to the color converting layer more efficiently, and in turn (ii) increase frontal luminance of the display device of the present embodiment.

The use of the above microresonator structure also makes it possible to (i) adjust the emission spectrum of the organic EL layer 12, and thus to (ii) adjust the emission spectrum so that it has a desired light emission peak wavelength and a half width. This arrangement can consequently control the emission spectrum of the organic EL layer 12 so that the emission spectrum is a spectrum that can effectively excite a fluorescent substance in the color converting layer.

In the case where the second electrode 13 is a translucent electrode, such an arrangement makes it possible to use even a portion of light emitted by the fluorescent substance layer 15 which portion travels in a direction opposite to the light extraction direction.

(5-3. Edge Cover)

The first electrode 11 described above preferably has an edge portion that is provided with an edge cover. Providing an edge cover can prevent a leak between the first electrode 11 and the second electrode 13.

The edge cover can be (i) formed of an insulating material by a publicly known method such as EB vapor deposition, sputtering, ion plating, and resistance heating vapor deposition and (ii) patterned by photolithography based on a publicly known dry method or wet method.

The edge cover can be made of a publicly known insulating material that transmits light, for example, SiO, SiON, SiN, SiOC, SiC, HfSiON, ZrO, HfO, or LaO. The edge cover preferably has a film thickness of 100 to 2000 nm. If the edge cover has a film thickness of less than 100 nm, no sufficient insulation will be provided, which will cause a leak between the first electrode 11 and the second electrode 13. This will in turn, for example, increase power consumption and/or prevent the light-emitting elements from emitting light. If the edge cover has a film thickness exceeding 2000 nm, such an edge cover may, for example, (i) require a long process time to be formed, with the result of decreased productivity, or (ii) break the second electrode 13.

The present invention is not limited by the above forming methods and materials.

The description below uses the term "organic EL substrate" to refer to a substrate formed by the above process to include the organic EL section 20.

(6. Sealing Film 14)

The light-emitting elements 1 through 3 each include a sealing film 14 between the second electrode 13 and the light-emitting layer 15. Providing the sealing film 14 can prevent oxygen, water and the like from entering the organic EL layer 12 from the outside, and thus allows the light-emitting elements to each have a longer life.

The sealing film 14 can be formed of a publicly known sealing material by a publicly known sealing method. The sealing film of the present embodiment needs to be made of a light-transmitting material. The sealing film 14 can be formed by, for example, (i) applying resin onto the second electrode 13 by spin coating, ODF, or lamination, or (ii) combining a resin film with the second electrode. The sealing film 14 can alternatively be formed by first forming an inorganic film of SiO, SiON, SiN or the like on the second electrode 13 by a method such as plasma CVD, ion plating, ion beam method, and sputtering, and then (i) applying resin by spin coating, ODF, or lamination, or (ii) combining a resin film with the second electrode.

The organic EL layer 12 may be sealed by using a sealing substrate for a substrate serving as the below-described CF-provided substrate 16. The sealing substrate may be made of a material, such as glass or metal, that contains sealed therein an inert gas such as nitrogen gas and argon gas. To reduce degradation, caused by water, of the organic EL section 20 effectively, the material of which the sealing substrate is made preferably contains, sealed therein, an inert gas that includes, for example, a moisture absorbent such as barium oxide.

The light-emitting elements 1 through 3 can each be prepared by, for example, combining, with the sealing film 16 inserted in-between, (i) a substrate (organic EL substrate) on which the organic EL section 20 has been formed with (ii) the CF substrate 16 (fluorescent substance substrate) on which the fluorescent substance layer 15 or the film-thickness adjusting layer 19 has been formed.

(7. Red Fluorescent Substance Layer 17 and Green Fluorescent Substance Layer 18)

The red-light-emitting element 1 includes, as the second light-emitting section, a red fluorescent substance layer 17 (color converting layer) for converting blue light into red light. The green-light-emitting element 2 includes, as the second light-emitting section, a green fluorescent substance layer 18 (color converting layer) for converting blue light into green light. The description below uses the term "fluorescent substance layer 15" to collectively refer to the red fluorescent substance layer 17 and the green fluorescent substance layer 18.

The following describes materials and forming methods for the red fluorescent substance layer 17 and the green fluorescent substance layer 18.

The red fluorescent substance layer 17 and the green fluorescent substance layer 18 may each (i) be made of only a fluorescent substance material mentioned below as an example, or include any additive and/or the like, and may (ii) include any of those materials as dispersed in a high-molecular material (binding resin) or in an inorganic material. These fluorescent substance layers are preferably separated from each other by a black matrix.

The red fluorescent substance layer 17 and the green fluorescent substance layer 18 can each be made of a publicly known fluorescent substance material. Such a fluorescent substance material is divided into an organic fluorescent substance material and an inorganic fluorescent substance material. The following lists specific compounds as examples of those fluorescent substance materials. The present invention is, however, not limited by the materials below.

The description below first deals with the organic fluorescent substance material. For use in the red fluorescent substance layer 17, the fluorescent substance material is, for example, (i) a cyanin pigment such as 4-dicyano methylene-2-methyl-6-(p-dimethylamino styllyl)-4H-pyrane, (ii) a pyridine pigment such as 1-ethyl-2-[4-(p-dimethylamino phenyl)-1,3-butadienyl]-pyridinium-perchlorate, or (iii) a rhodamine pigment such as rhodamine B, rhodamine 6G, rhodamine 3B, rhodamine 101, rhodamine 110, basic violet 11, and sulforhodamine 101. For use in the green fluorescent substance layer 18, the fluorescent substance material is, for example, (i) a coumarin pigment such as 2,3,5,6-1H, 4H-tetrahydro-8-trifluo methyl quinolizine (9,9a,1-gh) coumarin (coumarin 153), 3-(2'-benzothiazolyl)-7-diethylamino coumarin (coumarin 6), and 3-(2'-benzoimidazolyl)-7-N,N-diethylamino coumarin (coumarin 7), or (ii) a naphthalimide pigment such as basic yellow 51, solvent yellow 11, and solvent yellow 116.

The following lists examples of the inorganic fluorescent substance material. For use in the red fluorescent substance layer 17, the fluorescent substance material is, for example, $Y_2O_2S:Eu^{3+}$, $YAlO_3:Eu^{3+}$, $Ca_2Y_2(SiO_4)_6:Eu^{3+}$, $LiY_9(SiO_4)_6O_2:Eu^{3+}$, $YVO_4:Eu^{3+}$, $CaS:Eu^{3+}$, $Gd_2O_3:Eu^{3+}$, $Gd_2O_2S:Eu^{3+}$, $Y(P,V)O_4:Eu^{3+}$, $Mg_4GeO_{5.5}F:Mn^{4+}$, $Mg_4GeO_6:Mn^{4+}$, $K_5Eu_{2.5}(WO_4)_{6.25}$, $Na_5Eu_{2.5}(WO_4)_{6.25}$, $K_5Eu_{2.5}(MoO_4)_{6.25}$, or, $Na_5Eu_{2.5}(MoO_4)_{6.25}$. For use in the green fluorescent substance layer 18, the fluorescent substance material is, for example, $(BaMg)Al_{16}O_{27}:Eu^{2+},Mn^{2+}$, $Sr_4Al_{14}O_{25}:Eu^{2+}$, $(SrBa)Al_{12}Si_2O_8:Eu^{2+}$, $(BaMg)_2SiO_4:Eu^{2+}$, $Y_2SiO_5:Ce_{3+}$, $Tb^{3+}$, $Sr_2P_2O_7$—$Sr_2B_2O_5:Eu^{2+}$, $(BaCaMg)_5(PO_4)_3Cl:Eu^{2+}$, $Sr_2Si_3O_8$—$2SrCl_2:Eu^{2+}$, $Zr_2SiO_4$, $MgAl_{11}O_{19}:Ce^{3+},Tb^{3+}$, $Ba_2SiO_4:Eu^{2+}$, $Sr_2SiO_4:Eu^{2+}$, or $(BaSr)SiO_4:Eu^{2+}$. The inorganic fluorescent substance material is preferably subjected to a surface reforming treatment as necessary by, for example, (i) a method involving a chemical treatment that uses a silane coupling agent or the like, (ii) a method involving a physical treatment that adds, for example, microparticles on a submicron order, or (iii) a method combining the above two methods. The above fluorescent substance material is, for the sake of its stability, preferably an inorganic fluorescent substance material in consideration of, for example, degradation due to excitation light and degradation due to light emission. In the case where the inorganic fluorescent substance material is used, that material preferably has an average particle size (d50) of 0.5 to 50 μm. If the average particle size is less than 0.5 μm, the fluorescent substance will have a significantly lower luminous efficiency. If the average particle size exceeds 50 μm, it will be extremely difficult to form a flat film. This will unfortunately allow a gap to be formed between the fluorescent substance layer 15 and the organic EL section 20. Specifically, such a gap (refractive index: 1.0) between the organic EL section 20 (refractive index: approximately 1.7) and the inorganic fluorescent substance layer 15 (refractive index: approximately 2.3) may (i) prevent light emitted from the organic EL section 20 from efficiently reaching the fluorescent substance layer 15 and thus (ii) decrease the luminous efficiency of the fluorescent substance layer 15.

In the case where the above polymer resin is a photosensitive resin, it can be patterned by photolithography. The photosensitive resin can be one of or a mixture of a plurality of photosensitive resins (that is, photo-curable resist materials) each containing a reactive vinyl group, such as acrylic acid resin, methacrylic acid resin, polyvinyl cinnamate resin and vulcanite resin.

The red fluorescent substance layer 17 and the green fluorescent substance layer 18 can each be formed, with use of an application liquid for forming a fluorescent substance layer which application liquid includes the above fluorescent substance material (pigment) and the resin material both dissolved and dispersed in a solvent, by a method such as (i) a publicly known wet process or dry process or (ii) a laser transfer method. The publicly known wet process includes (i) an application method (for example, spin coating, dipping, doctor blade method, discharge coating, and spray coating) and (ii) a printing method (for example, inkjet printing, relief printing, intaglio printing, screen printing, and micro gravure coating). The publicly known dry process includes resistance heating vapor deposition, electron beam (EB) vapor deposition, molecular-beam epitaxy (MBE), sputtering, and organic vapor-phase deposition (OVPD).

The fluorescent substance layer 15 typically has a film thickness of approximately 100 nm to 100 μm, but preferably has a film thickness of 1 to 100 μm. If the red fluorescent substance layer 17 or the green fluorescent substance layer 18 has a film thickness of less than 100 nm, such a fluorescent substance layer will be unable to sufficiently absorb blue light emitted by the organic EL section 20. This will problematically decrease the luminous efficiency of the light-emitting elements 1 and 2 and/or cause transmitted blue light to be mixed with converted light, resulting in a decrease in color purity. The fluorescent substance layer preferably has a film thickness of not less than 1 μm in order to (i) further absorb blue light emitted by the organic EL section 20 and to (ii) reduce transmitted blue light to a degree that does not allow an adverse effect to be caused on color purity. On the other hand, even if the red fluorescent substance layer 17 or the green fluorescent substance layer 18 has a film thickness exceeding 100 μm, such a film thickness will not contribute to an increase in the luminous efficiency of the light-emitting elements 1 and 2 because even a film thickness smaller than that allows sufficient absorption of blue light emitted by the organic EL section 20. Such a large film thickness will merely consume the material and thus result in an increase in material costs.

The fluorescent substance layer 15 is particularly set such that the optical distance from (i) a position from which converted light is emitted to (ii) a light extraction surface varies between the respective colors for the light-emitting elements 1 and 2. The present specification describes a case in which the above light emission position corresponds to a surface of the fluorescent substance layer 15 which surface faces the organic EL layer 12.

The fluorescent substance layer 15 has a light extraction efficiency that is determined on the basis of (i) the above optical distance and (ii) the color (wavelength) of converted light of the fluorescent substance layer 15. This indicates that in the case where the optical distance is set for each color of the light-emitting elements 1 and 2 so that converted light can easily be extracted from the fluorescent substance layer 15, the light-emitting elements 1 and 2 can each have improved luminous efficiency. A known method can be used to determine an optical distance that allows high extraction efficiency (see, for example, PCT International Publication WO2006/009039).

The optical distance of the fluorescent substance layer 15 is determined by the product of (i) the film thickness of the fluorescent substance layer 15 and (ii) the refractive index thereof. Thus, adjusting at least one of the film thickness and refractive index of the fluorescent substance layer 15 can set the optical distance.

The film thickness of the fluorescent substance layer 15 can be adjusted by changing (i) a printing condition (squeegee pressure, squeegee attack angle, squeegee speed, or clearance width) for screen printing mentioned above, (ii) specifications (selection of screen gauze, thickness of an emulsion, tension, or strength of a frame) of a screen plate, or (iii) specifications (viscosity, fluidity, or combination ratio of a resin, a pigment, and a solvent) of an application liquid for forming a fluorescent substance.

The refractive index of the fluorescent substance layer 15 can be adjusted by changing, for example, materials of the fluorescent substance layer 15 or the combination ratio of such materials.

In the case where, for instance, the red fluorescent substance layer 17 and the green fluorescent substance layer 18 have respective refractive indexes that are equivalent to each other, the film thickness of the red fluorescent substance layer 17 is preferably larger than that of the green fluorescent substance layer 18 as illustrated in FIG. 1.

As described above, adjusting the above optical distance for the fluorescent substance layer 15 can improve efficiency of extracting light of the fluorescent substance layer 15.

In other words, the display device of the embodiment is arranged to (i) increase the intensity of light of the first light-emitting section with use of a microresonator structure in each of the light-emitting elements 1 and 2 and to (ii) adjust the optical distance to improve efficiency of extracting light of the second light-emitting section. This arrangement makes it possible to produce a display device having further improved luminous efficiency.

In a case that involves a display device which includes, in addition to red-, green-, and blue-light-emitting elements, a plurality of primary color elements of white, yellow, magenta, cyan and the like, such a display device may include a fluorescent substance layer 15 corresponding to each color. This arrangement can, for example, reduce power consumption and widen the color reproduction range. Fluorescent substance layers 15 corresponding respectively to a plurality of primary colors can be easily formed by photolithography involving a resist, a printing method, or a wet forming method rather than, for example, separate painting involving a mask.

(8. Film Thickness Adjusting Layer 19)

The red fluorescent substance layer 17 and the green fluorescent substance layer 18 are each arranged as described above. The blue-light-emitting element 3, on the other hand, does not include a fluorescent substance layer 15, but includes a film-thickness adjusting layer 19 instead. Providing a film-thickness adjusting layer 19 in the blue-light-emitting element 3 can adjust the difference in thickness between (i) the red-light-emitting element 1 and the green-light-emitting element and (ii) the blue-light-emitting element.

The film-thickness adjusting layer 19 is preferably first formed on a substrate (for example, the described-below CF-provided substrate 16) as with the fluorescent substance layer 15. The film-thickness adjusting layer 19 can be formed of the material of the interlayer insulating film or the material of the planarizing film by the method for forming the interlayer insulating film or the method for forming the planarizing film. The film-thickness adjusting layer 19 may alternatively be formed by screen printing with use of a different application liquid that is identical to the above application liquid for forming a fluorescent substance layer except that the different application liquid includes no red or green pigment.

The substrate (fluorescent substance layer substrate) on which the fluorescent substance layer 15 has been formed preferably has a surface that is planarized by, for example, the planarizing film described above. This arrangement can (i) prevent a gap from being formed between the organic EL section 20 and the fluorescent substance layer 15 when the fluorescent substance layer substrate is combined with the organic EL substrate, and also (ii) increase adherence between the fluorescent substance layer substrate and the organic EL substrate.

(9. CF-Provided Substrate 16)

The display device of the present embodiment preferably includes a CF-provided substrate 16 on the light extraction side. The CF-provided substrate 16 is a substrate provided with a color filter for a corresponding one of the individual colors, the color filter being provided between that substrate and the fluorescent substance layer 15 or the film-thickness adjusting layer 19. The color filter can be a conventional color filter.

The color filter of the CF-provided substrate 16 can (i) increase color purity for the respective pixels of red, green, and blue corresponding respectively to the light-emitting elements 1 through 3, and (ii) widen the color reproduction range of the display device of the present embodiment. The red-light-emitting element 1 includes a red color filter provided on its fluorescent substance layer 15, and the green-light-emitting element 2 includes a green color filter provided on its fluorescent substance layer 15, each of the red and green color filters absorbing a blue component and ultraviolet component of external light. This arrangement can thus (i) reduce or prevent light emission, caused by external light, of a fluorescent substance layer, and (ii) reduce or prevent a decrease in contrast of the display device of the present embodiment.

(10. Polarizing Plate)

The display device of the present embodiment preferably includes a polarizing plate on the light extraction side. The polarizing plate can be a combination of a conventional linear polarizing plate and a λ/4 plate. The provision of the polarizing plate can prevent, for example, (i) the first electrode 11 and the second electrode 13 from reflecting external light and (ii) the substrate or the sealing substrate from reflecting external light by its surface. This arrangement can thus improve contrast of the display device of the present embodiment.

(Other)

The present invention is not limited to the description of the embodiment above, but may be altered in various ways by a skilled person within the scope of the claims. Any embodiment based on a combination of technical means appropriately altered within the scope of the claims is also encompassed in the technical scope of the present invention.

As described above, a display device of the present invention includes: a plurality of arranged light-emitting elements including light-emitting elements emitting light of respective colors different from one another, the plurality of arranged light-emitting elements each including: a pair of electrodes forming a microresonator structure and including a translucent electrode; an organic EL layer sandwiched between the pair of electrodes; and a color converting layer provided on a side of the translucent electrode which side is opposite to a side on which the organic EL layer is provided, such that the translucent electrode is sandwiched between the color converting layer and the organic EL layer, the color converting layer (i) absorbing light emitted by the organic EL layer and having a first color and (ii) emitting converted light having a second color different from the first color, the color converting layer having an optical distance extending from (i) a first surface of the color converting layer which first surface faces the translucent electrode to (ii) a second surface of the color converting layer at which second surface the converted light is extracted, the optical distance being varied according to each color of light emitted by the plurality of arranged light-emitting elements.

The display device of the present invention may preferably be arranged such that the color converting layer has a film thickness that is varied according to the each color of light emitted by the plurality of arranged light-emitting elements.

The above arrangement further facilitates adjusting the optical distance of the light converting layer.

The display device of the present invention may preferably be arranged such that the optical distance is smaller for, among the plurality of arranged light-emitting elements, a light-emitting element emitting light of a color having a shorter wavelength.

The above arrangement makes it possible to suitably set the optical distance of the color converting layer in each light-emitting element in order to further facilitate extracting converted light.

The display device of the present invention may preferably be arranged such that the plurality of arranged light-emitting elements include a red-light-emitting element and a green-light-emitting element; and the optical distance is smaller for the green-light-emitting element than for the red-light-emitting element.

The above arrangement allows the display device of the present invention to be suitably produced in the form of a color display.

The display device of the present invention may preferably be arranged such that the color converting layer of the red-light-emitting element has a film thickness of not less than 85 μm and not greater than 100 μm.

The display device of the present invention may preferably be arranged such that the color converting layer of the green-light-emitting element has a film thickness of not less than 55 μm and not greater than 85 μm.

The color converting layer, in the case where it is formed of a typical material by a typical method, normally has a refractive index of around 2.0. Thus, setting the film thickness of the converting layer as defined in the above arrangements facilitates forming a color converting layer with a desirable optical distance with use of a typical material by a typical method.

The display device of the present invention may preferably be arranged such that in a case where (i) the organic EL layer emits blue light and (ii) the plurality of arranged light-emitting elements include a blue-light-emitting element, the blue-light-emitting element includes a film-thickness adjusting layer instead of the color converting layer.

The above arrangement allows the blue-light-emitting element to have a viewing angle characteristic that is identical to the respective viewing angle characteristics of the optical light-emitting elements other than the blue-light-emitting element. The above arrangement in turn makes it possible to suitably prepare the display device of the present invention.

The display device of the present invention may be arranged such that the film-thickness adjusting layer includes (i) an inorganic material including silicon oxide, silicon nitride, or tantalum oxide or (ii) an organic material including a polyimide, an acrylic resin, or a resist material.

The display device of the present invention may preferably be arranged such that the organic EL layer emits ultraviolet light; and the color converting layer of each of the plurality of arranged light-emitting elements corresponds to a color for the each of the plurality of arranged light-emitting elements.

The above arrangement allows the blue-light-emitting element to have a viewing angle characteristic that is identical to the respective viewing angle characteristics of the optical light-emitting elements other than the blue-light-emitting element. The above arrangement in turn makes it possible to suitably prepare the display device of the present invention.

The display device of the present invention may preferably be arranged such that the plurality of arranged light-emitting elements include, in addition to a red-light-emitting element, a blue-light-emitting element, and a green-light-emitting element, at least one of a white-light-emitting element, a yellow-light-emitting element, a magenta-light-emitting element, and a cyan-light-emitting element.

The above arrangement widens the color reproduction range and reduces power consumption. The color converting layer can be easily formed by photolithography involving a resist, a printing method, or a wet forming method rather than, for example, separate painting involving a mask.

The description below deals in greater detail with (i) individual members of the display device of the present embodiment and (ii) a method for producing the display device. The present invention is, however, not limited to the description below.

Example

The description below deals in greater detail with the present invention on the basis of an Example. The present invention is, however, not limited by the Example below.

<Preparation of Each Light-Emitting Element>

The present Example prepared, in correspondence with the respective colors of red, green, and blue, light-emitting elements 1 through 3 each with various film thicknesses for the fluorescent substance layer 15 or film-thickness adjusting layer 19.

The description below first deals with a method for preparing each light-emitting element.

(Formation of Organic EL Substrate)

The present Example formed, on a glass substrate having a thickness of 0.7 mm, a silver film with a film thickness of 100 nm by sputtering as a reflective electrode, and then formed, on that silver film, an indium tin oxide (ITO) film with a film thickness of 20 nm by sputtering. This operation formed a reflective electrode (anode) as a first electrode. The present Example then patterned the first electrode by conventional photolithography into 90 stripes each having an electrode width of 2 mm.

The present Example next formed, on the reflective electrode, a $SiO_2$ layer with a thickness of 200 nm by sputtering, and patterned the layer by conventional photolithography so that the layer would cover an edge portion of the reflective electrode. This operation formed an interlayer insulating film and a planarizing film. The interlayer insulating film was so structured that $SiO_2$ covered a part of the reflective electrode which part extended for 10 μm from the edge of each short side. The present Example washed the product with water, and then carried out, with respect to the product, pure water ultrasonic washing for 10 minutes, acetone ultrasonic washing for 10 minutes, and isopropyl alcohol vapor washing for 5 minutes. The present Example then dried the resulting product at 100° C. for 1 hour.

The present Example next fixed a substrate to a substrate holder in an inline resistance heating vapor deposition device, and reduced the pressure inside the device to a vacuum of $1\times10^{-4}$ Pa or less in order to form individual organic layers for an organic EL layer 12.

The present Example first, with use of 1,1-bis-di-4-tolylamino-phenyl-cyclohexane (TAPC) as a positive hole injection material, formed a positive hole injection layer with a film thickness of 100 nm by resistance heating vapor deposition.

The present Example next, with use of N,N'-di-1-naphthyl-N,N'-dipheny-1,1'-biphenyl-1,1'-biphenyl-4,4'-diamine (NPD) as a positive hole transport material, formed a positive hole transport layer with a film thickness of 40 nm by resistance heating vapor deposition.

The present Example then formed a blue organic light-emitting layer (thickness: 30 nm) at a desired pixel position on the positive hole transport layer. The present Example prepared this blue organic light-emitting layer by co-depositing 1,4-bis-triphenylsilyl-benzene (UGH-2) (host material) and bis[(4,6-difluorophenyl)-pyridinato-N,C2']picolinate iridium (III) (FIrpic) (blue phosphorescence-emitting dopant) at respective vapor deposition speeds of 1.5 Å/sec and 0.2 Å/sec.

The present Example next formed, with use of 2,9-dimethyl-4,7-dipheny-1,10-phenanthroline (BCP), a positive hole blocking layer (thickness: 10 nm) on the organic light-emitting layer.

The present Example then formed, with use of tris(8-hydroxy quinoline) aluminum (Alq3), an electron transport layer (thickness: 30 nm) on the positive hole blocking layer.

The present Example next formed, with use of lithium fluoride (LiF), an electron injection layer (thickness: 0.5 nm) on the electron transport layer.

The above process formed the individual organic layers for an organic EL layer 12.

The present Example then formed a translucent electrode as a second electrode. Specifically, the present Example first fixed a substrate in a metal vapor deposition chamber, and aligned the substrate with a shadow mask for forming a translucent electrode. This shadow mask was a mask having openings for forming a translucent electrode, the openings being in the shape of stripes each having a width of 2 mm and extending in a direction at right angles to the stripes of the reflective electrode. The present Example next co-deposited magnesium and silver on a surface of the organic EL layer by vacuum deposition at respective vapor deposition speeds of 0.1 Å/sec and 0.9 Å/sec. This operation formed a desired pattern of magnesium silver (thickness: 1 nm). The present Example further formed, on the magnesium silver, a desired pattern of silver (thickness: 19 nm) at a vapor deposition speed of 1 Å/sec. This silver pattern was intended to increase an interference effect and prevent a voltage drop caused in the second electrode by wiring resistance. This operation formed a translucent electrode.

The above arrangement allows for a microcavity effect (interference effect) between the reflective electrode (first electrode 11) and the semi-transmissive electrode (second electrode 13), which makes it possible to increase the frontal luminance. The above arrangement thus allows light emission energy from the organic EL section to be propagated more efficiently with use of a fluorescent substance layer.

The above process prepared an organic EL substrate including an organic EL section.

(Formation of Fluorescent Substance Substrate)

The present Example next formed a red fluorescent substance layer and a green fluorescent substance layer on respective CF-provided glass substrates each having a thickness of 0.7 mm. Specifically, the present Example formed the fluorescent substance layers as described below.

To form a red fluorescent substance layer, the present Example first added 15 g of ethanol and 0.22 g of γ-glycidoxypropyl triethoxysilane to 0.16 g of an aerosol having an average particle size of 5 nm, and stirred the mixture in an open system at room temperature for 1 hour. The present Example then placed this mixture and 20 g of red fluorescent substance (pigment) $K_5Eu_{2.5}(WO_4)_{6.25}$ in a mortar, and crushed and mixed them well. The present Example next heated the resulting mixture in a 70° C. oven for 2 hours, and further heated the resulting mixture in a 120° C. oven for 2 hours. This operation produced $K_5Eu_{2.5}(WO_4)_{6.25}$ having a reformed surface. The present Example then added, to 10 g of the surface-reformed $K_5Eu_{2.5}(WO_4)_{6.25}$, 30 g of polyvinyl alcohol dissolved in a mixed solution (300 g) of water:dimethyl sulfoxide with the ratio of 1:1, and stirred the resulting mixture in a dispersing device. This operation prepared an application liquid for forming a red fluorescent substance layer. The present Example applied the thus prepared application liquid for forming a red fluorescent substance layer at a red pixel position on the CF-provided glass substrate 16 by screen printing so that the resulting layer would have a width of 3 mm. The present Example next heated the substrate in a vacuum oven (conditions: 200° C. and 10 mmHg) for 4 hours to dry it. This operation formed a red fluorescent substance layer.

To form a green fluorescent substance layer, the present Example first added 15 g of ethanol and 0.22 g of γ-glycidoxypropyl triethoxysilane to 0.16 g of an aerosol having an average particle size of 5 nm, and stirred the mixture in an open system at room temperature for 1 hour. The present Example then placed this mixture and 20 g of green fluorescent substance (pigment) $Ba_2SiO_4:Eu^{2+}$ in a mortar, and crushed and mixed them well. The present Example next heated the resulting mixture in a 70° C. oven for 2 hours, and further heated the resulting mixture in a 120° C. oven for 2 hours. This operation produced $Ba_2SiO_4:Eu^{2+}$ having a reformed surface. The present Example then added, to 10 g of the surface-reformed $Ba_2SiO_4:Eu^{2+}$, 30 g of polyvinyl alcohol (resin) dissolved in a mixed solution (300 g: solvent) of water:dimethyl sulfoxide with the ratio of 1:1, and stirred the resulting mixture in a dispersing device. This operation prepared an application liquid for forming a green fluorescent substance layer. The present Example applied the thus prepared application liquid for forming a green fluorescent substance layer at a green pixel position on the CF-provided glass substrate 16 by screen printing so that the resulting layer would have a width of 3 mm. The present Example next heated the substrate in a vacuum oven (conditions: 200° C. and 10 mmHg) for 4 hours to dry it. This operation formed a green fluorescent substance layer.

The present Example varied the respective film thicknesses of the red fluorescent substance layer and the green fluorescent substance layer from 30 to 100 μm by varying the viscosity (that is, the combination ratio of a resin, a pigment, and a solvent) of each application liquid.

The above process prepared (i) a fluorescent substance substrate on which a red fluorescent substance layer was provided and (ii) a fluorescent substance substrate on which a green fluorescent substance layer was provided.

The film thicknesses mentioned in the present specification can be measured with use of a stylus profilometer, an optical film thickness measuring system (three-dimensional surface roughness measuring instrument, ellipsometry).

(Formation of Film Thickness Adjusting Layer Substrate)

The present Example formed, at a blue pixel position on the CF-provided glass substrate having a thickness of 0.7 mm, a film-thickness adjusting layer with use of a material and method similar to those for the planarizing film described above. The present Example varied the film thickness of the film-thickness adjusting layer from 0 to 100 μm.

The above process prepared a film-thickness adjusting layer substrate for the blue-light-emitting element.

(Assembly of Light-Emitting Elements 1 Through 3)

For each of the red-light-emitting element 1 and the green-light-emitting element 2, the present Example aligned the organic EL section substrate and the fluorescent substance substrate, prepared as described above, with an alignment marker provided outside a pixel placement position. Similarly for the blue-light-emitting element 3, the present Example aligned the organic EL section substrate and the film-thickness adjusting layer substrate, prepared as described above, with an alignment marker provided outside a pixel placement position. The present Example applied a thermosetting resin to the fluorescent substance substrates and the film-thickness adjusting layer substrate before the alignment.

The present Example, after the alignment, closely attached the two substrates to each other with the thermosetting resin in-between, and heated the product at 90° C. for 2 hours for curing. The present Example carried out the step of attaching the two substrates to each other in a dry air environment (moisture content: −80° C.) in order to prevent the organic EL layer 12 from degrading due to water.

The present Example finally connected, to an outside power supply, terminals provided along the periphery of each of the light-emitting elements 1 through 3.

<Light Extraction Efficiency>

Measurements were made of outside quantum yields (at 10 mA/cm$^2$) of light, actually extracted to the outside, of each of the light-emitting elements. The measurements of the outside quantum yields were made with use of a fluorescence spectrophotometer with an integrating sphere attached thereto.

Figure 2:
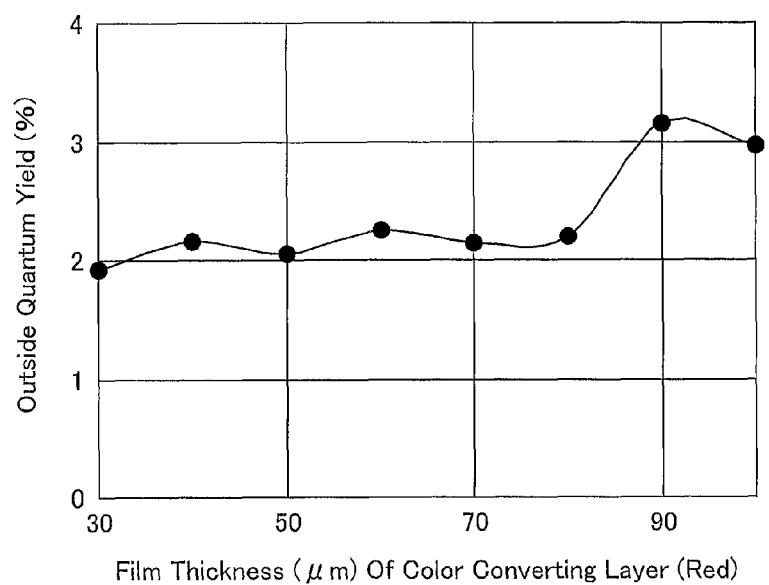
FIG. 2 is a graph indicative of the relation, observed in a red-light-emitting element, between the film thickness of a fluorescent substance layer and an outside quantum yield.
Figure 3:
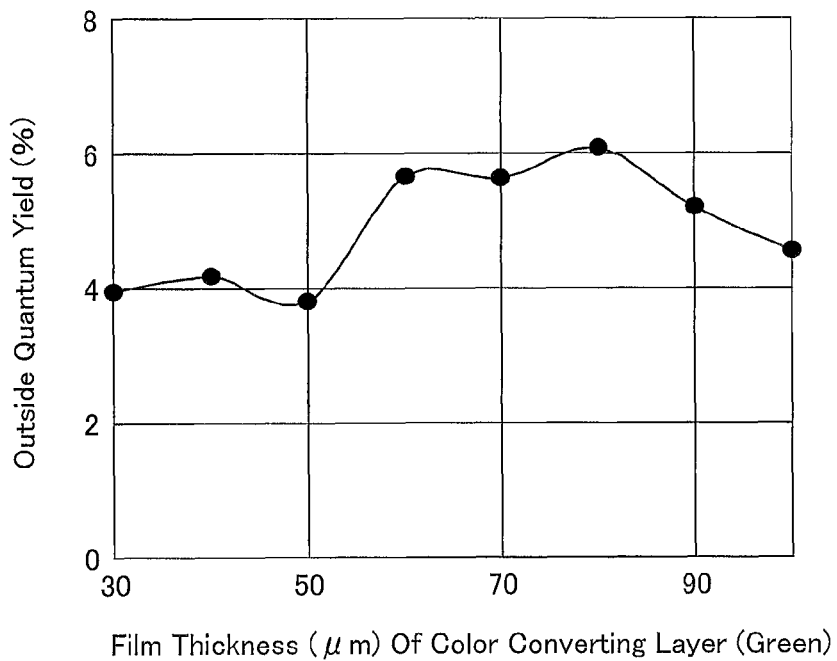
FIG. 3 is a graph indicative of the relation, observed in a green-light-emitting element, between the film thickness of a fluorescent substance layer and an outside quantum yield.
Figure 4:
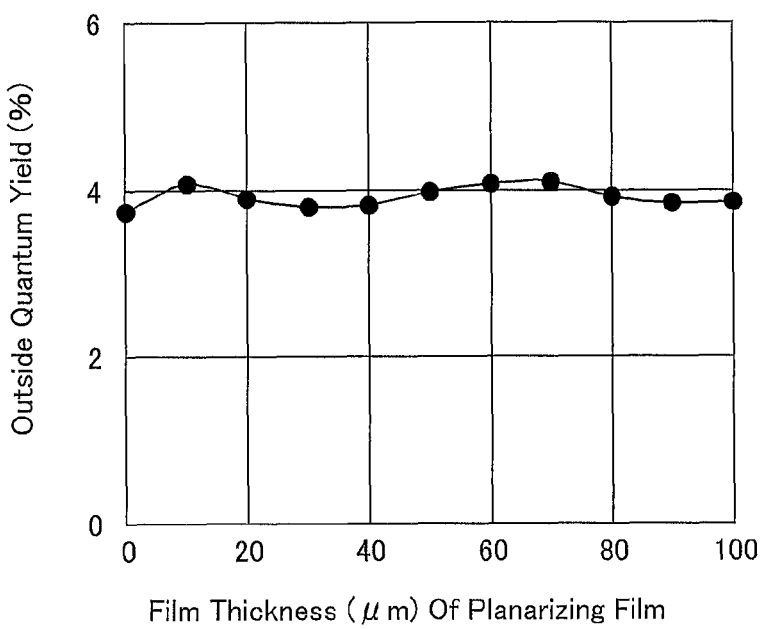
FIG. 4 is a graph indicative of the relation, observed in a blue-light-emitting element, between the film thickness of a film-thickness adjusting layer and an outside quantum yield.

FIGS. 2 through 4 illustrate results of the measurements. FIG. 2 is a graph indicative of the relation, observed in the red-light-emitting element, between the film thickness of the fluorescent substance layer and an outside quantum yield. FIG. 3 is a graph indicative of the relation, observed in the green-light-emitting element, between the film thickness of the fluorescent substance layer and an outside quantum yield. FIG. 4 is a graph indicative of the relation, observed in the blue-light-emitting element, between the film thickness of the film-thickness adjusting layer and an outside quantum yield.

FIG. 2 indicates results showing that the red-light-emitting element achieved a high outside quantum yield when including a fluorescent substance layer having a film thickness of not less than 85 μm and not greater than 100 μm. The outside quantum yield was, in particular, highest with a fluorescent substance layer having a film thickness of around 90 nm.

FIG. 3 indicates results showing that the green-light-emitting element achieved a maximum outside quantum yield when including a fluorescent substance layer having a film thickness of not less than 55 μm and not greater than 85 μm. The outside quantum yield was, in particular, highest with a fluorescent substance layer having a film thickness of around 70 nm.

FIG. 4 indicates, on the other hand, results showing that the blue-light-emitting element had an outside quantum yield that varied very little according to the film thickness of the film-thickness adjusting layer.

The present Example had a substantially equal refractive index (refractive index of 2.0 with respect to light having a wavelength of 520 nm) for all of the fluorescent substance layers and the film-thickness adjusting layer. This indicates that the optical distance is larger for the red-light-emitting element than for the green-light-emitting element, the optical distance being calculated by multiplying the film thickness of a fluorescent substance layer (that is, the distance between (i) a surface of the fluorescent substance layer which surface faces the second electrode 13 and (ii) a surface of the fluorescent substance layer which surface faces the CF-provided glass substrate) by the refractive index of the fluorescent substance layer.

The present Example describes a case involving an inorganic fluorescent substance. A tendency similar to the above was observed also in a case involving an organic fluorescent substance.

INDUSTRIAL APPLICABILITY

The present invention is suitably applicable to an organic EL display device.

REFERENCE SIGNS LIST 1 red-light-emitting element
2 green-light-emitting element
3 blue-light-emitting element
11 first electrode
12 organic EL layer
13 second electrode
14 sealing film
15 fluorescent substance layer (color converting layer)
16 CF-provided substrate
19 film-thickness adjusting layer
20 organic EL section

The invention claimed is:

1. A display device comprising:
a plurality of arranged light-emitting elements including light-emitting elements having respective colors different from one another,
the plurality of arranged light-emitting elements each including:
a pair of electrodes forming a microresonator structure and including a translucent electrode;
an organic EL layer sandwiched between the pair of electrodes; and
a color converting layer provided on a side of the translucent electrode which side is opposite to a side on which the organic EL layer is provided, such that the translucent electrode is sandwiched between the color converting layer and the organic EL layer,
the color converting layer (i) absorbing light emitted by the organic EL layer and having a first color and (ii) emitting converted light having a second color different from the first color,
the color converting layer having an optical distance extending from (i) a first surface of the color converting layer which first surface faces the translucent electrode to (ii) a second surface of the color converting layer at which second surface the converted light is extracted, the optical distance being varied according to each color of the plurality of arranged light-emitting elements.

2. The display device according to claim 1,
wherein:
the color converting layer has a film thickness that is varied according to said each color of the plurality of arranged light-emitting elements.

3. The display device according to claim 1,
wherein:
the optical distance is smaller for, among the plurality of arranged light-emitting elements, a light-emitting element emitting light of a color having a shorter wavelength.

4. The display device according to claim 1,
wherein:
the plurality of arranged light-emitting elements include a red-light-emitting element and a green-light-emitting element; and
the optical distance is smaller for the green-light-emitting element than for the red-light-emitting element.

5. The display device according to claim 4,
wherein:
the color converting layer of the red-light-emitting element has a film thickness of not less than 85 μm and not greater than 100 μm.

6. The display device according to claim 4,
wherein:
the color converting layer of the green-light-emitting element has a film thickness of not less than 55 μm and not greater than 85 μm.

7. The display device according to claim 1,
wherein:
in a case where (i) the organic EL layer emits blue light and (ii) the plurality of arranged light-emitting elements further include a blue-light-emitting element, the blue-light-emitting element includes a film-thickness adjusting layer instead of the color converting layer.

8. The display device according to claim 7,
wherein:
the film-thickness adjusting layer includes (i) an inorganic material including silicon oxide, silicon nitride, or tantalum oxide or (ii) an organic material including a polyimide, an acrylic resin, or a resist material.

9. The display device according to claim 1,
wherein:
the organic EL layer emits ultraviolet light; and
the color converting layer of each of the plurality of arranged light-emitting elements corresponds to a color for said each of the plurality of arranged light-emitting elements.

10. The display device according to claim 1,
wherein:
the plurality of arranged light-emitting elements include, in addition to a red-light-emitting element, a blue-light-emitting element, and a green-light-emitting element, at least one of a white-light-emitting element, a yellow-light-emitting element, a magenta-light-emitting element, and a cyan-light-emitting element.

* * * * *